(12) United States Patent
Vobecky et al.

(10) Patent No.: US 8,912,623 B2
(45) Date of Patent: Dec. 16, 2014

(54) FAST RECOVERY DIODE

(75) Inventors: Jan Vobecky, Lenzburg (CH); Arnost Kopta, Zurich (CH); Marta Cammarata, Niederlenz (CH)

(73) Assignee: ABB Technology AG, Zurich (CH)

( * ) Notice: Subject to any disclaimer, the term of this patent is extended or adjusted under 35 U.S.C. 154(b) by 368 days.

(21) Appl. No.: 12/942,476

(22) Filed: Nov. 9, 2010

(65) Prior Publication Data

US 2011/0108941 A1     May 12, 2011

(30) Foreign Application Priority Data

Nov. 9, 2009 (EP) .................................. 09175419

(51) Int. Cl.
*H01L 29/739* (2006.01)
*H01L 29/32* (2006.01)
*H01L 29/66* (2006.01)
*H01L 29/861* (2006.01)

(52) U.S. Cl.
CPC .............. *H01L 29/861* (2013.01); *H01L 29/32* (2013.01); *H01L 29/66136* (2013.01)
USPC ........................................................ 257/477

(58) Field of Classification Search
CPC .. H01L 29/32; H01L 29/66136; H01L 29/861
USPC .................................. 257/476, 477, 484, 156
See application file for complete search history.

(56) References Cited

U.S. PATENT DOCUMENTS

| 6,218,683 B1* | 4/2001 | Koga et al. ..................... 257/156 |
| 2003/0062584 A1* | 4/2003 | Takahashi ..................... 257/458 |
| 2005/0116249 A1 | 6/2005 | Mauder et al. |
| 2008/0079119 A1 | 4/2008 | Inque |
| 2008/0173968 A1 | 7/2008 | Schulze et al. |

FOREIGN PATENT DOCUMENTS

| EP | 0 657 945 A2 | 6/1995 |
| EP | 1 014 453 A1 | 6/2000 |

OTHER PUBLICATIONS

Search Report issued on Apr. 7, 2010, by the European Patent Office for Application No. 09175419.2.
Sze, "Physics of Semiconductor Devices, 2nd Edition", 1981, pp. 78, XP-002574541.
Kim et al., "Electrical characterization of proton irradiated p+-n-n+ Si diode", Physica B, 2006, pp. 181-184.

(Continued)

*Primary Examiner* — Marcos D. Pizarro
*Assistant Examiner* — Sue Tang
(74) *Attorney, Agent, or Firm* — Buchanan Ingersoll & Rooney PC

(57) ABSTRACT

A fast recovery diode includes a base layer of a first conductivity type. The base layer has a cathode side and an anode side opposite the cathode side. An anode buffer layer of a second conductivity type having a first depth and a first maximum doping concentration is arranged on the anode side. An anode contact layer of the second conductivity type having a second depth, which is lower than the first depth, and a second maximum doping concentration, which is higher than the first maximum doping concentration, is also arranged on the anode side. A space charge region of the anode junction at a breakdown voltage is located in a third depth between the first and second depths. A defect layer with a defect peak is arranged between the second and third depths.

9 Claims, 10 Drawing Sheets

(56) References Cited

OTHER PUBLICATIONS

Nishiwaki et al., "A Fast & Soft Recovery Diode with Ultra Small Qrr (USQ-Diode) Using Local Lifetime Control by He Ion Irradiation", Proceedings of the 13th International Symposium on Power Semiconductor Devices & ICS, Jun. 4, 2001, pp. 235-238.

Vobecky et al., "Helium irradiated high-power P-i-N diode with low ON-state voltage drop", Solid-State Electronics, 2003, pp. 45-50, vol. 47.

Vobecky, Radiation-Enhanced Diffusion of Palladium for a Local Lifetime Control in Power Devices, Jun. 2007, pp. 1521-1526, vol. 54, No. 6.

* cited by examiner

US 8,912,623 B2

FAST RECOVERY DIODE

RELATED APPLICATION

This application claims priority under 35 U.S.C. §119 to European Patent Application No. 09175419.2 filed in Europe on Nov. 9, 2009, the entire content of which is hereby incorporated by reference in its entirety.

FIELD

The present disclosure relates to the field of power electronics. More particularly, the present disclosure relates to a fast recovery diode, and to a method for manufacturing such a fast recovery diode.

BACKGROUND INFORMATION

As shown in FIG. 1, a known diode 10 includes an n-doped base layer 2 having a cathode side 23 and an anode side 24 opposite the cathode side 23. On the anode side 24, a p-doped anode layer 25 is arranged, and a metal layer which functions as an anode electrode 4 is arranged on top of the p-doped anode layer 25. A higher (n+) doped cathode buffer layer 22 is arranged on the cathode side 23. A metal layer in form of a cathode electrode 3 is arranged on top of the (n+) doped cathode buffer layer 22. On the anode side 24, there are defect centers, which can be created by a Hydrogen or Helium irradiation, arranged near the junction in the p-doped anode layer 25. By the defect layer 45, reverse recovery current is reduced and thereby, the power losses and softness of the device improved. However, leakage current is high in a diode with such a defect layer 45, and the amount of leakage current varies strongly with the position of the peak of the defect layer 45.

Because of the high leakage, the devices cannot operate above 125° C. As the doping profile is very steep, a small variation in the doping profile due to a spread in production results in large differences of other relevant device parameters after the irradiation. To maintain the production yield high, a tight control of both the doping profile and irradiation energy are required.

SUMMARY

An exemplary embodiment provides a fast recovery diode. The exemplary diode includes a base layer of a first conductivity type, where the base layer has a cathode side and an anode side opposite the cathode side. The exemplary diode includes an anode buffer layer of a second conductivity type having a first depth and a first maximum doping concentration on the anode side. In addition, the exemplary diode includes an anode contact layer of the second conductivity type having a second depth, which is lower than the first depth, and a second maximum doping concentration, which is higher than the first maximum doping concentration. The exemplary diode also includes a space charge region of the anode junction at a breakdown voltage, which is located between a third depth and the cathode side, the third depth being arranged between the first and the second depth, where the first, second and third depths are measured from the anode side. The exemplary diode also includes a defect layer with a defect peak, which is arranged between the second depth and the third depth.

An exemplary embodiment provides a method for manufacturing a fast recovery diode. The exemplary method includes providing a wafer of a first conductivity type, where the wafer has a cathode side and an anode side opposite the cathode side, and creating an anode buffer layer by applying first ions of a second conductivity type on the anode side, and by diffusing the first ions into the wafer to create the anode buffer layer with a first depth and a first maximum doping concentration. The exemplary method also includes creating an anode contact layer by applying second ions of the second conductivity type on the anode side, and by diffusing the second ions into the wafer to create the anode contact layer with a second depth, which is lower than the first depth, and a second maximum doping concentration, which is higher than the first maximum doping concentration. In addition, the exemplary method includes forming a cathode electrode and an anode electrode, and irradiating the wafer with third ions to create a defect layer having a defect peak. An energy of the third ions is such that the defect peak is arranged between the second depth and a third depth. The third depth is smaller than the first depth, and the third depth is a depth between which depth and the cathode side at a breakdown voltage of the device a space charge region of the anode junction is located. The first, second and third depths are measured from the anode side.

BRIEF DESCRIPTION OF THE DRAWINGS

Additional refinements, advantages and features of the present disclosure are described in more detail below with reference to exemplary embodiments illustrated in the drawings, in which.

The reference symbols used in the drawings and their meaning are summarized in the list of reference symbols. Generally, alike or alike-functioning parts are given the same reference symbols. The described embodiments are meant as examples and shall not confine the disclosure.

DETAILED DESCRIPTION

Figure 1:
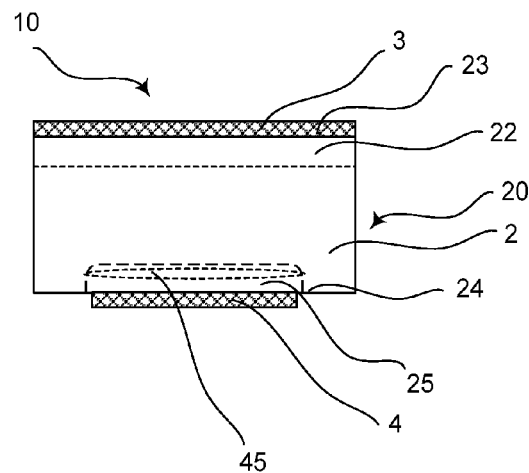
FIG. 1 shows a known free-wheeling diode with an anode layer and a defect layer.

Exemplary embodiments of the present disclosure provide a fast recovery diode with lower switching losses and lower reverse leakage current and therefore a higher thermal operation range than known devices. In addition, exemplary embodiments of the present disclosure provide a manufacturing method for such a device.

According to an exemplary embodiment, the fast recovery diode includes a base layer of a first conductivity type with a cathode side and an anode side opposite the cathode side. An anode buffer layer of a second conductivity type with a first depth and a first maximum doping concentration is arranged on the anode side. By this anode buffer layer, the electric field is stopped during reverse bias before it reaches the defect layer.

An anode contact layer of the second conductivity type with a second depth, which is lower than the first depth, and a second maximum doping concentration, which is higher than the first maximum doping concentration, is arranged on the anode side. This anode contact layer provides a good ohmic contact and high ruggedness during fast recovery in case overloading conditions arise.

An anode electrode is arranged on top of the anode contact layer on the side opposite the base layer. The anode electrode can be in the form of a metal layer, for example.

A third depth is defined as the depth from the anode side, in which the space charge region of the anode junction at a breakdown voltage is located. The depths and doping concentrations are chosen such that the third depth is located between the first and second depths. Between the second and the third depth, a defect peak of a defect layer is located.

By placing the defect layer between the crossing point of the anode buffer and anode contact layer, the doping concentration is low and therefore, the electron-hole plasma in the on-state can be significantly reduced. This improves the SOA of the diode and soft recovery can be achieved. Due to the slower drop of the doping concentration in the anode buffer layer than in the anode contact layer, the process is less delicate to effects, which influence the depth of the defect layer. At the same time, the defect layer is placed into a region which is not reached by the space charge region (SCR) of the anode junction at breakdown voltage. Thereby, the leakage current can be kept low. By keeping the peak of the defect centers at a smaller depth than the depth of the SCR, the radiation defects do not increase the leakage current, because they are not present at the SCR. Local lifetime control can be achieved due to the presence of the defect centers without enhancing the leakage current. Thereby, the diode can be operated at higher temperatures than known devices, such as up to 175° C., for example.

The method for manufacturing the diode according to exemplary embodiments of the present disclosure provides advantages over known methods for the production of discrete high power diodes with deep diffused profiles, because due to the creation of highly doped and a low doped anode layer with the depth typically only up to 25 µm, the diffusion times can be reduced. As diffusion times of 20 hours are sufficient to create such a depth of the p doped layers, creation of defects and contamination is also reduced compared to long diffusion processes. Therefore, an additional gettering process to subsequently remove such defects and contaminants is not necessary.

Both the anode buffer and contact layer and even the termination layer may be produced with one single mask, thus reducing manufacturing costs and delicate mask alignments.

In the case of discrete power diodes, the diode thickness can be reduced if combined with planar junction termination. Consequently, the ON-state and turn-off losses can be reduced significantly.

The exemplary diode according to the present disclosure can advantageously be used as a free-wheeling or clamping diode in IGCT (Integrated gate commutated thyristor) and/or a free-wheeling diode in IGBT (insulated gate bipolar transistor) applications.

In the exemplary embodiments described below, a first conductivity type refers to an n-type conductivity, and a second conductivity type refers to a p-type conductivity. However, it is to be understood that the conductivity types can also be reversed.

Figure 12:
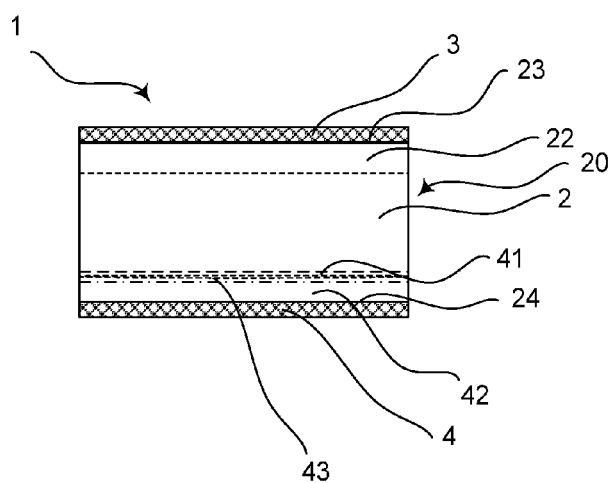
FIG. 12 shows an exemplary diode according to an embodiment of the present disclosure.

FIG. 12 shows a fast recovery diode 1 according to an exemplary embodiment of the present disclosure. The fast recovery diode 1 includes a wafer 20. Part of the wafer 20 with unamended doping during the manufacturing process forms a base layer 2 of a first conductivity type, e.g., n-type, having a cathode side 23 and an anode side 24 opposite the cathode side 23. There may be an n-doped cathode buffer layer 22 arranged on the cathode side 23. In case of the diode 1 having such a cathode buffer layer 22, the cathode buffer layer 22 has a higher doping than the (n−) doped base layer 2. A cathode electrode 3 is arranged on top of the cathode buffer layer 22 on the side of the cathode buffer layer 22 opposite the base layer 2.

An anode electrode 4 is arranged on the anode side of the wafer 20. According to an exemplary embodiment, the cathode electrode 3 and/or anode electrode 4 can be in the form of a metal layer. A p-doped anode contact layer 42 is arranged on the anode side 24 with a second depth 420 (FIG. 19).

According to an exemplary embodiment, the second depth can be approximately 5 µm, for example. Between the anode contact layer 42 and the base layer 2, a p doped anode buffer layer 41 is arranged in a first depth 410 (FIG. 19). According to an exemplary embodiment, the first depth can be approximately 25 µm, for example. The anode buffer layer 41 surrounds the anode contact layer 42. The doping concentration of the anode buffer layer 41 is lower than the doping concentration of the anode contact layer 42.

Figure 19:
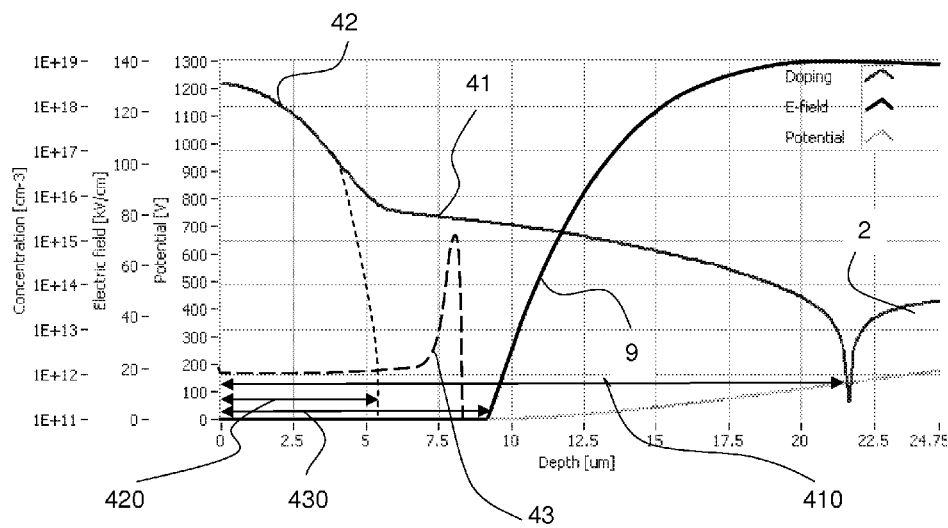
FIG. 19 shows doping concentration, electric field and potentials for an exemplary diode according to an embodiment of the present disclosure.

A space charge region 9 of the anode junction during operation at a breakdown voltage is located in a third depth 430 between the first and the second depth 410, 420, as shown in FIG. 19. A defect layer 43 is arranged such that its defect peak is arranged between the second and the third depth 420, 430. The defect layer 43 may be a continuous layer over the whole area of the wafer, or the defect layer 43 may be laterally limited such that the defect layer 43 is located in a plane parallel to the surface of the wafer 20 at least partly over the area of the anode buffer layer 41 or over the whole area of the anode buffer layer 41.

The first, second and third depths are measured from the anode sided surface of the wafer 20.

The depth of penetrating a space charge region (SCR) into the anode doping profile under reverse bias can be measured or it can also be theoretically calculated. For example, for a breakdown voltage in a silicon wafer, the SCR can be estimated using the so-called breakthrough charge $Q=1.5*10^{12}$ cm$^{-2}$. At breakdown, the SCR penetrates into a distance from the anode junction (p-n junction) at which the integral of the acceptor concentration reaches $\int N_a . dx = Q = 1.51*10^{12}$ cm$^{-2}$. Accordingly, for a case of a higher doping profile, the SCR penetrates less than if the concentration is lower.

According to an exemplary embodiment, the maximum doping concentration of the anode contact layer 42, which can be the surface doping concentration of the anode contact layer 42, can be in a range between $10^{17}$ and $5*10^{19}$/cm$^3$ and of the anode buffer layer 41 below $5*10^{16}$/cm$^3$, such as between $10^{15}$/cm$^3$ and $3*10^{16}$/cm$^3$, for example.

Figure 18:
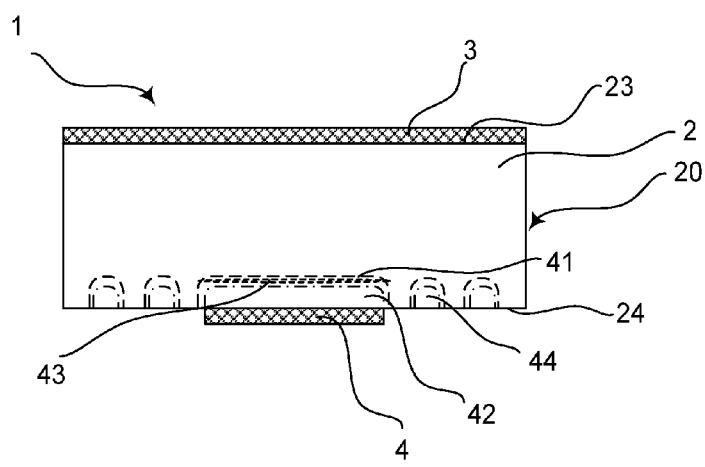
FIG. 18 shows another diode according to the disclosure.

In an exemplary embodiment shown in FIG. 18, there are p-doped termination layers 44 arranged on the anode side 24 in the termination area 21 of the wafer 20. These termination layers 44 surround the anode buffer and anode contact layers 41, 42.

Figure 23:
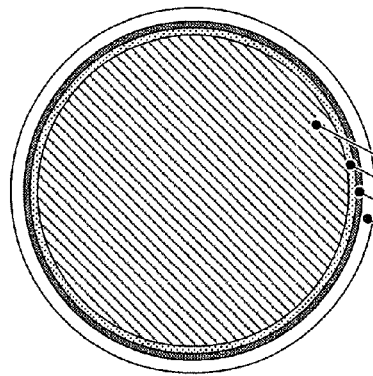
FIG. 23 shows circular shape of the anode contact layer and anode buffer layer for a device according to FIG. 12.
Figure 24:
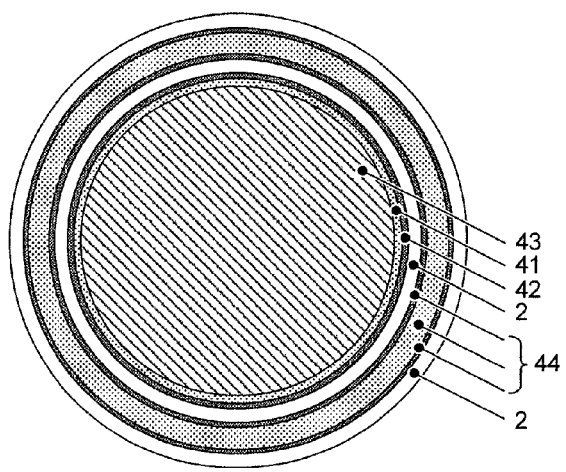
FIG. 24 shows such a device with a termination layer (as in FIG. 18, but shown with one termination layer 44).

In another exemplary embodiment, the anode buffer layer 41 and/or the anode contact layer 42 may have a circular shape (see FIG. 23) or a quadrilateral shape like a rectangular or square shape. In the case of the diode 1 including termination layers 44, these may also have a ring shape or a quadrilateral frame shape. According to an exemplary embodiment, the termination layers 44 can have the corresponding shape (see FIGS. 23 and 24).

Figure 25:
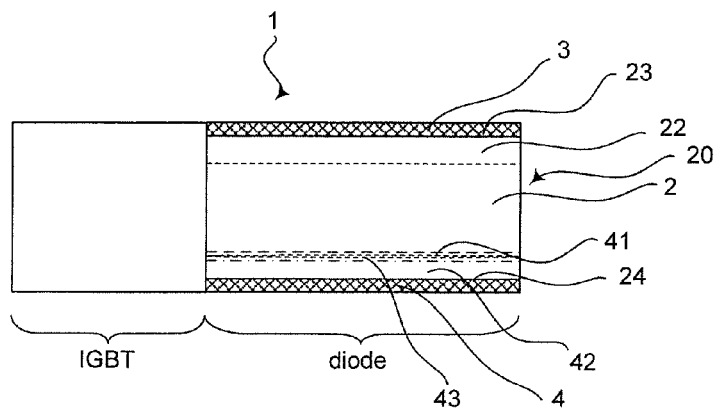
FIG. 25 shows a device including an insulated gate bipolar transistor (IGBT) and a diode.
Figure 26:
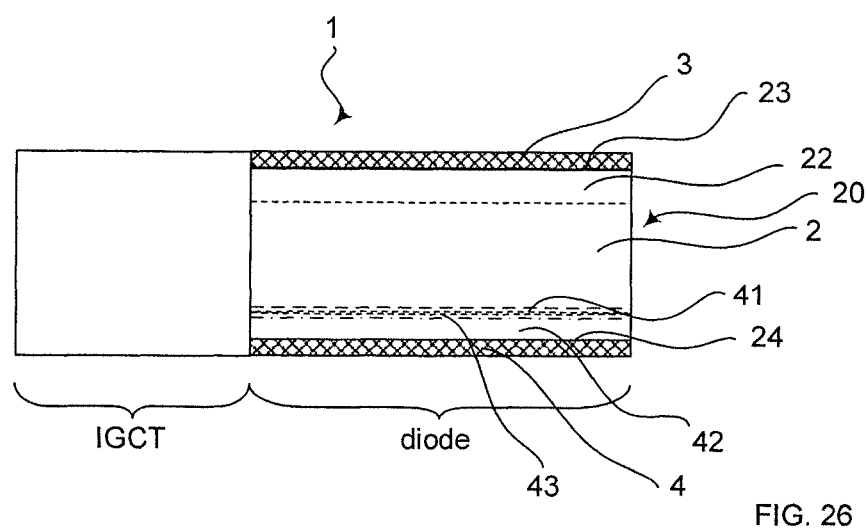
FIG. 26 shows a device including an integrated gate commutated thyristor (IGCT) and a diode.

In another exemplary embodiment, the diode 1 is used as a free-wheeling diode for IGCT (Integrated gate commutated thyristor) (see FIG. 26) and/or IGBT (insulated gate bipolar transistor) (see FIG. 25) applications.

Figure 2:
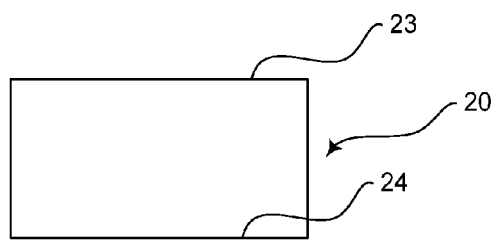
FIGS. 2 to 11 show an exemplary manufacturing method for manufacturing a diode according to an embodiment of the present disclosure.
Figure 3:
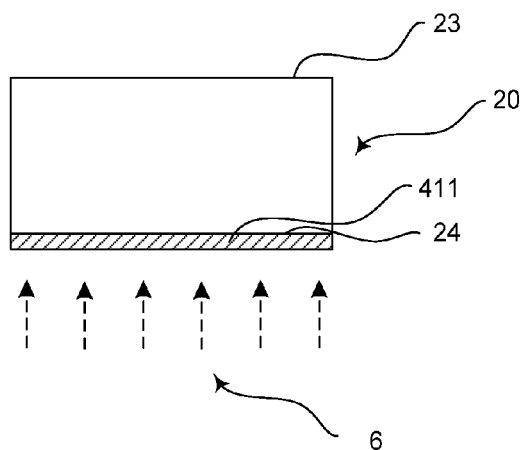
Figure 4:
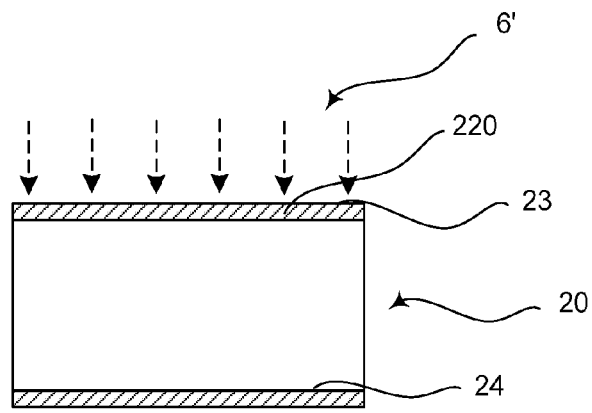
Figure 5:
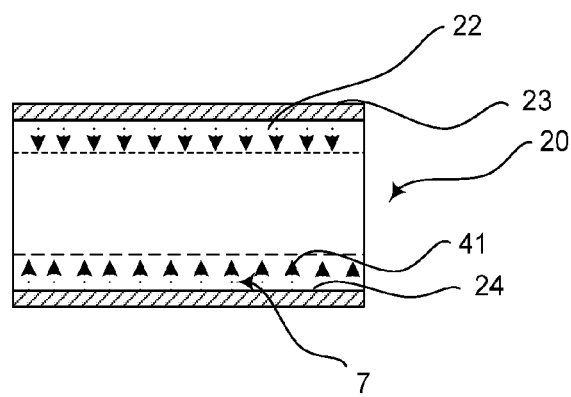
Figure 6:
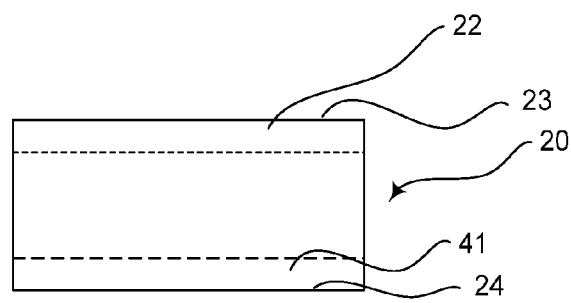
Figure 7:
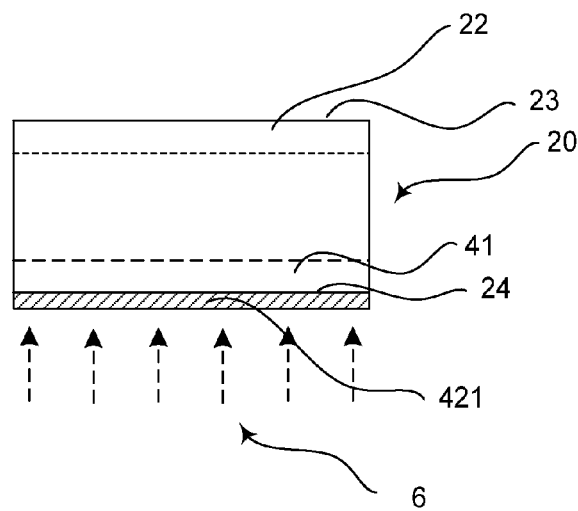
Figure 8:
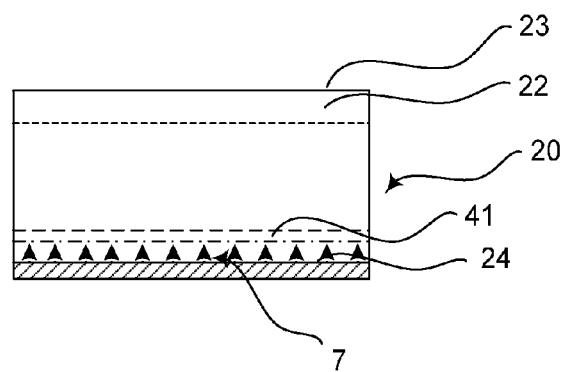
Figure 9:
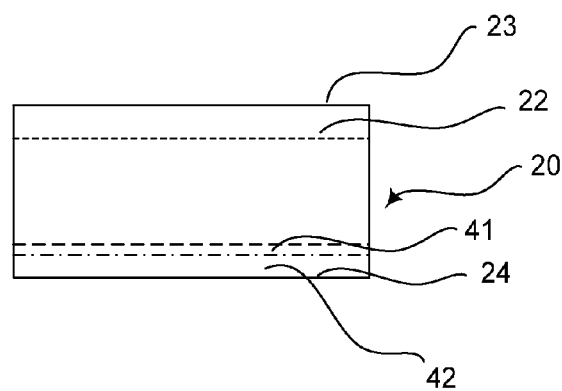

The diode 1 can be manufactured by the following manufacturing method including the following steps. As shown in FIG. 2, an n type wafer 20 is provided with a first side, e.g. a cathode side 23, and a second side, e.g. an anode side 24 opposite the cathode side 23. For the manufacturing of a pn-junction, on the anode side 24 of the wafer, the anode buffer layer 41 is created by a process of implantation of first ions 411 followed by diffusion 7 (FIG. 3). Afterwards, the first ions 411 are driven into the wafer 20 up to a desired first depth 410 (FIGS. 5 and 6). For example, the first ions 411 can be driven into the wafer 20 by heating the wafer up for several hours, e.g., up to 20 hours. A p-type anode contact layer 42 is created by implanting second ions 421 into the wafer 20 (FIG. 7). Afterwards, the second ions 421 are driven in the wafer 20 by diffusion to a second depth 420 (FIGS. 8 and 9). Instead of implantation, other techniques such as particle deposition can be used for applying the ions 411, 421 on the wafer 20. By the process disclosed in FIGS. 3 to 9, no mask is used so that continuous layers 41, 42 are created over the whole wafer plane.

In an exemplary embodiment, boron is used as the first ions 411 and as the second ions 421. This has the advantage that known methods with double implantations or diffusions using different ion types such as Al and Ga are avoided, in which Al tends to diffuse out of the wafer and the diffusion of Ga is not maskable because Ga readily diffuses through $SiO_2$ so that the photomasking of $SiO_2$ masking layers does not work. Though the Boron diffusion as used in the present disclosure is slower, it is not a limiting factor, because the diffusion depths are much shallower than in the known devices.

Figure 10:
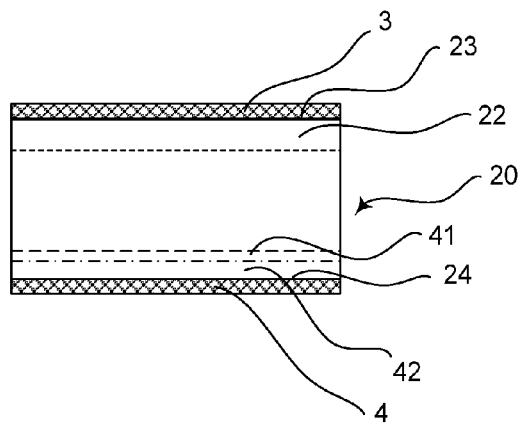

Then, a metallization process can be performed on both sides of the wafer 23, 24 in order to create a metal layer as a cathode electrode 3 on the cathode side 23 and another metal layer as an anode electrode 4 on the anode side 24 (FIG. 10).

Figure 11:
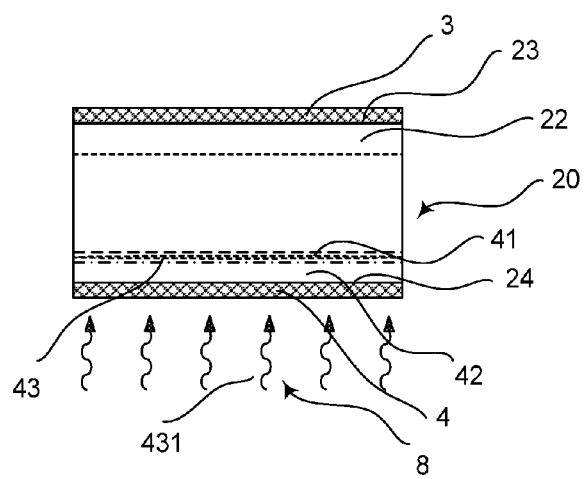
Figure 21:
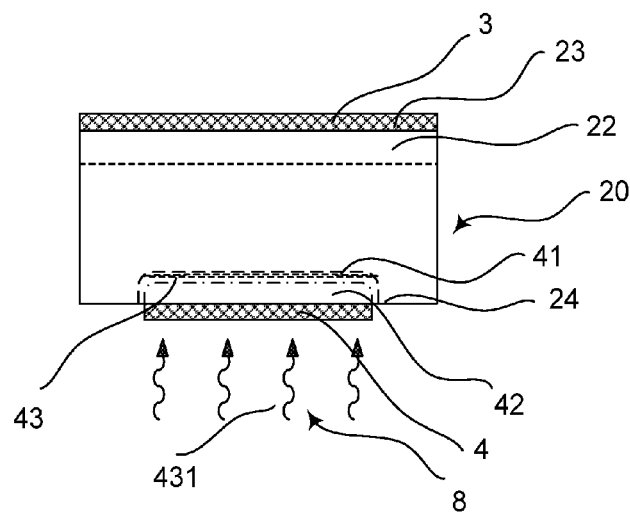
Figure 22:
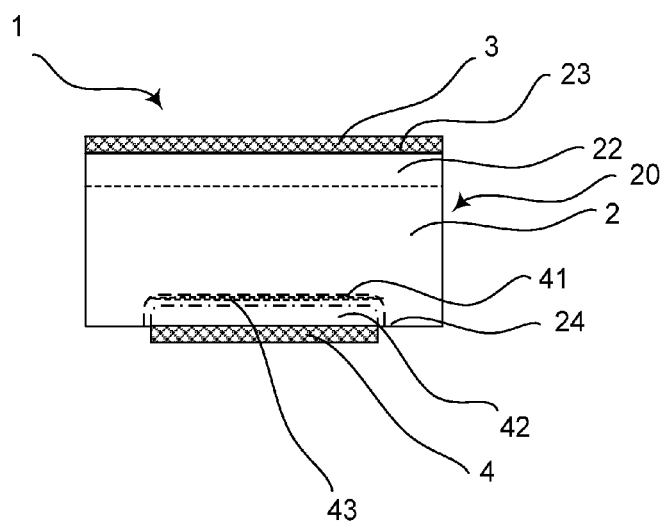
FIG. 22 shows an exemplary diode according to an embodiment of the present disclosure.

Afterwards, the wafer 20 is irradiated with third type ions 431 (represented by the curved arrows in FIG. 11) for the manufacturing of the defect layer 43, and the wafer 20 is annealed. According to an exemplary embodiment, the third type ions 431 can be protons or helium. Energy and concentration of the ions are chosen such that the desired depth and dose concentration of the defect layer 43 is achieved. The defect layer 43 may be created by using a laterally limited ion beam or by using a mask (as shown in FIG. 21) in order to laterally limit the defect layer 43 to a particular area, which corresponds at least partly to the area of the anode buffer layer 41 in a plane parallel to the surface of the wafer or which corresponds to the whole area of the anode buffer layer 41. FIG. 22 illustrates an exemplary diode that is manufactured according to the exemplary process illustrated in FIG. 21. Alternatively, the defect layer 43 may also be a continuous layer over the whole area of the wafer 20 (FIG. 11).

Figure 20:
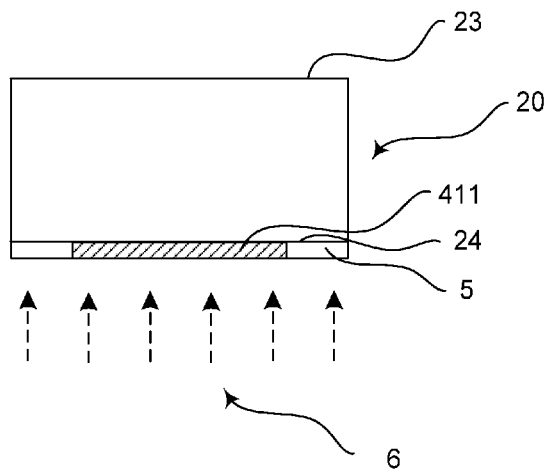
FIGS. 20 to 21 show another exemplary manufacturing method for manufacturing a diode according to an embodiment of the present disclosure.

In another exemplary embodiment, a mask 5 is applied on the anode side 24 for applying the first and/or second ions 411, 421 exemplarily shown in FIG. 20 for the first ions 411. Thereby, the anode buffer and/or anode contact layer 41, 42 is laterally limited, such as to a central area of the wafer 20, for example. In this example, the central area shall be understood as an area which does not include the termination area 21, also called edge area, of the wafer 20. The mask 5 can then be removed afterwards.

Figure 13:
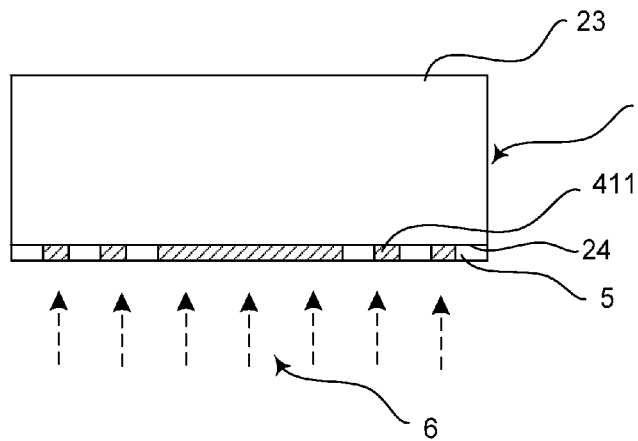
FIGS. 13 to 17 show another exemplary manufacturing method for manufacturing a diode according to an embodiment of the present disclosure.
Figure 14:
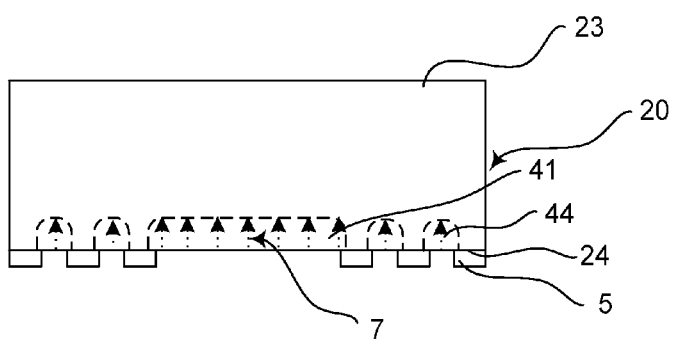
Figure 15:
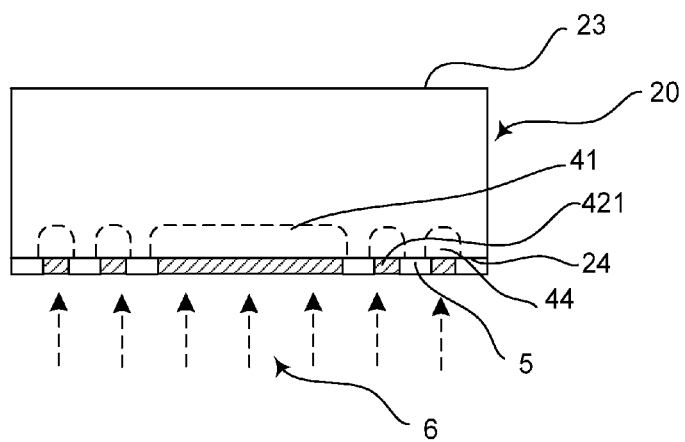
Figure 16:
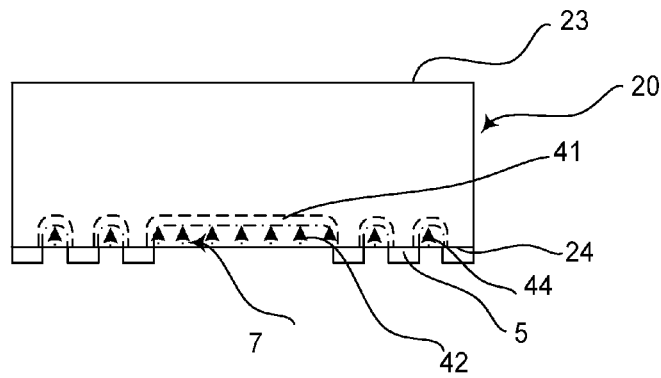
Figure 17:
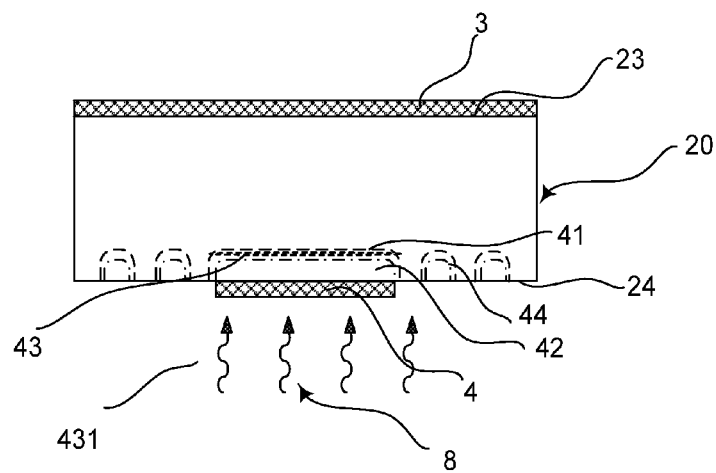

Also, a planar junction termination can be created in order to maintain the voltage blocking capability of the device. The manufacturing method is similar to that for a device without termination layers with the following exceptions. For the creation of such an edge termination, the mask 5 may have an opening in the central part of the wafer as explained above, and the mask 5 may include further openings in the termination area 21 of the wafer in order to create termination layers 44 (FIGS. 13 and 14). The termination layers 44 can be created simultaneously with the anode buffer layer 41 and/or anode contact layer 42 (FIGS. 15 and 16). The termination layers 44 may be made by one implantation or deposition of first or second ions 411, 421 together with diffusion 7, or they may be made by diffusion 7 of first and second ions 411, 421. Of course, it is also possible to apply ions for the creation of the termination layer 44 separately from the first or second ions and diffuse them, to use a separate mask for the creation of the termination layer 44 or other methods for creation of a termination layer 44 may be applied (like etching methods in the termination area 21). The defect layer 43 may be laterally limited to the area of the anode buffer layer 41 (FIGS. 17 and 18).

On the cathode side 23, there may be a cathode buffer layer 22 with a higher doping than the base layer 2 created. This can be done by processes such as fourth ion implantation or deposition, e.g. with phosphorous, on the cathode side 23 (FIG. 4), which fourth ions 220 are then diffused into the wafer 20. Such a process may be performed simultaneously with the creation of the anode buffer or anode contact layer 41, 42 or separately, i.e. before or after the creation of the layers on the anode side 24.

In a further step, the diode 1 may be irradiated with electrons over the whole device or through a mask in order to further reduce turn-off losses of the device (represented by the arrows in FIG. 18).

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST diode 1
base layer 2
wafer 20
termination area 21
cathode buffer layer 22
fourth ions 220
cathode side 23
anode side 24
anode layer 25
cathode electrode 3
anode electrode 4 anode buffer layer 41
first ions 411
first depth 410
anode contact layer 42
second depth 420
second ions 421
defect layer 43
third depth 430
third ions 431
termination layer 44
defect layer 45
mask 5
implantation 6, 6'
diffusion 7
irradiation 8

What is claimed is:

1. A fast recovery diode comprising:
a base layer of a first conductivity type, the base layer having a cathode side and an anode side opposite the cathode side;
an anode buffer layer of a second conductivity type having a first depth and a first maximum doping concentration on the anode side;
an anode contact layer of the second conductivity type having a second depth, which is lower than the first depth, and a second maximum doping concentration, which is higher than the first maximum doping concentration;
a space charge region of the anode junction at a breakdown voltage, which is located between a third depth and the cathode side, the third depth being arranged between the first and the second depth, the first, second and third depths being measured from the anode side;
a defect layer with a defect peak, which is arranged in the anode buffer layer between the second depth and the third depth,
wherein the anode buffer layer has a first surface which borders the base layer at the first depth, a second surface which borders the anode contact layer at the second depth, and first and second ends, and
wherein the entirety of the defect layer extends continuously between the first and second surfaces and the first and second ends of the anode buffer layer.

2. The diode according to claim 1, wherein at least one of the anode buffer layer and the anode contact layer have a circular shape.

3. The diode according to claim 1, wherein the diode comprises at least one termination layer of the second conductivity type, the at least one termination layer being arranged on the anode side in a termination area of the diode.

4. The diode according to claim 3, wherein any of the at least one termination layer have at least one of a circular shape and a quadrilateral shape.

5. A device comprising an integrated gate commutated thyristor and the diode according to claim 1.

6. The diode according to claim 1, wherein at least one of the anode buffer layer and the anode contact layer have a quadrilateral shape.

7. The diode according to claim 6, wherein the diode comprises at least one termination layer of the second conductivity type, the at least one termination layer being arranged on the anode side in a termination area of the diode.

8. The diode according to claim 7, wherein any of the at least one termination layer have at least one of a circular shape and a quadrilateral shape.

9. A device comprising an insulated gate bipolar transistor and the diode according to claim 1.

* * * * *